United States Patent
Wei et al.

(10) Patent No.: US 8,148,929 B2
(45) Date of Patent: Apr. 3, 2012

(54) POWER ELECTRONIC MODULE IGBT PROTECTION METHOD AND SYSTEM

(75) Inventors: Lixiang Wei, Whitefish Bay, WI (US); Masahiro Tsuyoshi, Brookfield, WI (US); Richard A. Lukaszewski, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 665 days.

(21) Appl. No.: 12/241,766

(22) Filed: Sep. 30, 2008

(65) Prior Publication Data

US 2010/0080024 A1    Apr. 1, 2010

(51) Int. Cl.
 *H02P 6/14* (2006.01)
(52) U.S. Cl. ............... 318/400.26; 318/400.2; 318/434; 318/471
(58) Field of Classification Search .......... 318/800, 318/801, 802, 344, 438, 471; 363/74, 77, 363/95, 98
See application file for complete search history.

(56) References Cited

U.S. PATENT DOCUMENTS

| | | | | |
|---|---|---|---|---|
| 5,068,777 A | * | 11/1991 | Ito | 363/97 |
| 5,280,228 A | * | 1/1994 | Kanouda et al. | 318/803 |
| 5,296,789 A | * | 3/1994 | Ohi | 318/400.08 |
| 5,859,510 A | * | 1/1999 | Dolan et al. | 318/400.28 |
| 5,923,135 A | * | 7/1999 | Takeda | 318/432 |
| 6,094,026 A | * | 7/2000 | Cameron | 318/471 |
| 6,992,452 B1 | * | 1/2006 | Sachs et al. | 318/434 |
| 7,038,415 B2 | * | 5/2006 | Nakamura et al. | 318/471 |
| 7,400,109 B2 | * | 7/2008 | Nomura et al. | 318/801 |
| 7,825,621 B2 | * | 11/2010 | Wei et al. | 318/801 |
| 2008/0251589 A1 | * | 10/2008 | Grbovic | 236/97 |

* cited by examiner

*Primary Examiner* — Bentsu Ro
*Assistant Examiner* — Thai Dinh
(74) *Attorney, Agent, or Firm* — Fletcher Yoder, P.C.; Alexander R. Kuszewski; John M. Miller

(57) ABSTRACT

A power electronics device with an improved IGBT protection mechanism is provided. More specifically, systems and methods are provided for reducing the switching frequency of an inverter module based on the junction temperature variation of the IGBT.

23 Claims, 7 Drawing Sheets

POWER ELECTRONIC MODULE IGBT PROTECTION METHOD AND SYSTEM

BACKGROUND

The invention relates generally to the field of electrical power converters and inverters. More particularly, the invention relates to techniques for preventing failure of motor drive circuitry due to overheating.

Power inverters and converters typically employ power modules to create a desired output current waveform, which is used to power various devices, such as motors and other equipment. The frequency and amplitude of the output current waveform may effect the operation of the device such as by changing the speed or torque of a motor, for example. Some power modules create the desired output current waveform through pulse width modulation, wherein power semiconductor switches such as insulated gate bipolar transistors (IGBTs) are caused to switch rapidly on and off in a particular sequence so as to create an approximately sinusoidal output current waveform. Furthermore, high IGBT switching speeds tend to produce a smoother, more ideal sinusoidal waveform, which may be desirable in some applications. For example, in heating, ventilating, and air conditioning systems a smoother sinusoidal waveform will reduce system noise and vibrations.

Higher IGBT switching speeds may tend, however, to increase the junction temperature of the IGBTs, which may result in more mechanical stress and increased rates of IGBT failure over time. Attempts have been made to reduce IGBT failure by limiting the maximum absolute IGBT junction temperatures. However, these techniques have failed to account for the increased stresses that tend to occur under start-up conditions or low-speed conditions, wherein the IGBTs tend to experience high current at low output frequency.

It may be advantageous, therefore, to provide a system and method of reducing IGBT thermal stress that is particularly effective under start-up conditions and low-speed, high-current conditions. Specifically, it may be advantageous to provide a method of reducing temperature variations of the IGBT junction, i.e. the semiconductor chip itself, and the case, i.e. the package in which the semiconductor chip is contained.

BRIEF DESCRIPTION

The present invention relates generally to an IGBT protection mechanism configuration designed to address such needs. Embodiments include systems and methods of reducing the switching frequency of an inverter module to avoid high junction temperature variation. Embodiments also include methods of estimating the expected junction temperature variation.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present invention relate to reducing the mechanical stress on IGBTs due to large temperature variations of the junction. Large junction temperature variations may contribute to particularly high levels of mechanical stress, because the different expansion rates of the various materials inside the IGBT package may lead to wire crack growth in wire bonds and similar contacts. Therefore, reducing junction temperature variations may result in a longer lasting inverter module. In embodiments of the present invention, the junction temperature variation is controlled by controlling the switching frequency. Because the highest junction temperature variations tend to occur during start-up or low-speed, high-current conditions, the switching frequency may be reduced for only a short time during start-up, after which the switching frequency may be increased to provide a smoother sinusoidal waveform.

Figure 1:
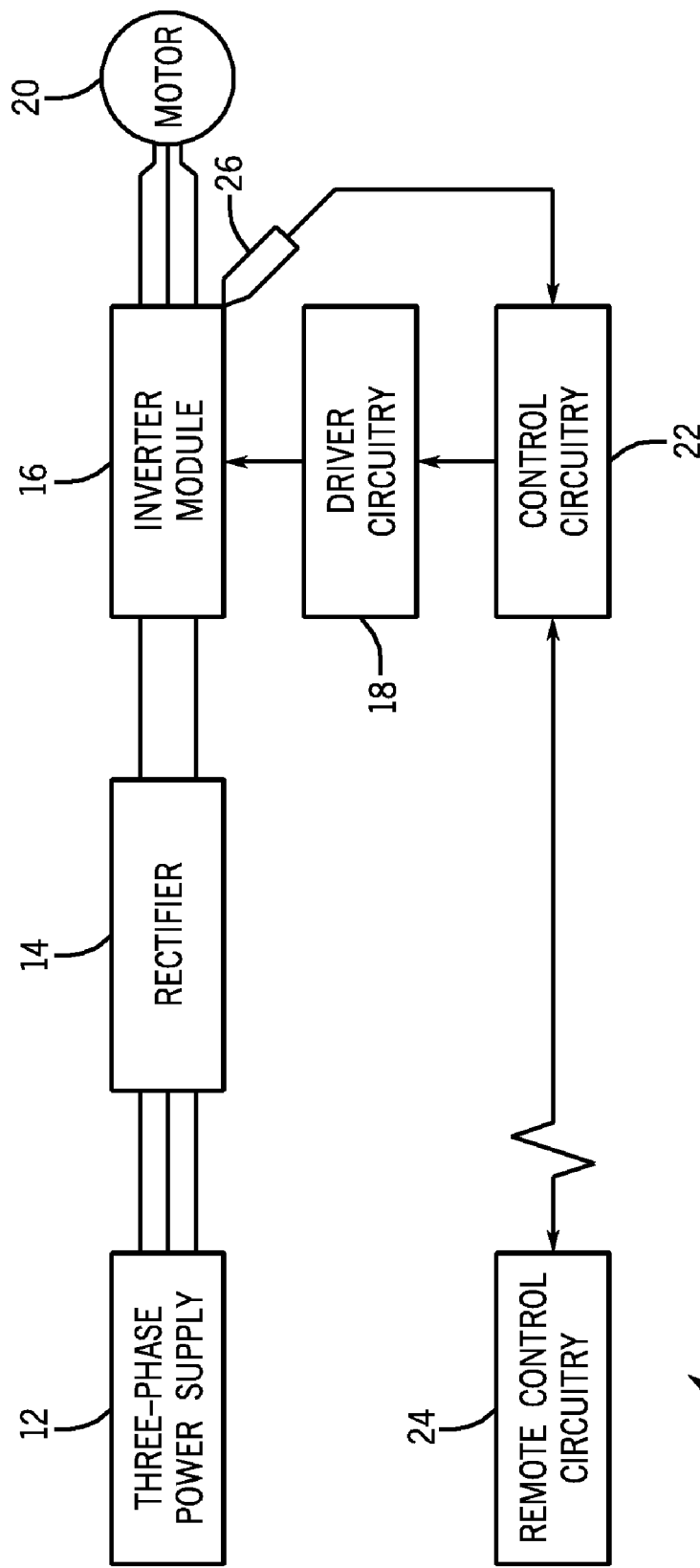
FIG. 1 is a block diagram of a motor drive system employing circuitry for preventing high junction temperature variation in accordance with embodiments of the present invention.

FIG. 1 illustrates an exemplary motor control system 10 employing circuitry for preventing extreme junction temperature variation under variable operating conditions. A three-phase power supply 12 provides a three-phase voltage waveform at a constant frequency to a rectifier 14, and may be derived from a generator or from an external power grid. Rectifier 14 performs full wave rectification of the three phase voltage waveform, outputting a direct current (DC) voltage to an inverter module 16.

Inverter module 16 accepts the positive and negative lines of DC voltage from the rectifier circuitry 14 and outputs a discretized three phase waveform at a desired frequency, independent of the frequency of three-phase power supply 12. Driver circuitry 18 provides inverter module 16 with appropriate signals, enabling inverter module 16 to output the waveform. The resulting three-phase waveform may thereafter drive a load, such as a motor 20.

Control circuitry 22 may receive commands from remote control circuitry 24, using such commands to enable driver circuitry 18 to properly control inverter module 16. In some embodiments, the motor control system may include one or more sensors 26 for detecting operating temperatures, voltages, currents, etc. With feedback data from sensors 26, control circuitry 22 may keep detailed track of the various conditions under which inverter module 16 may be operating. The feedback data may further allow control circuitry 22 to determine when inverter module 16 may be approaching a high temperature, allowing the control circuitry to implement preventative measures.

Figure 2:
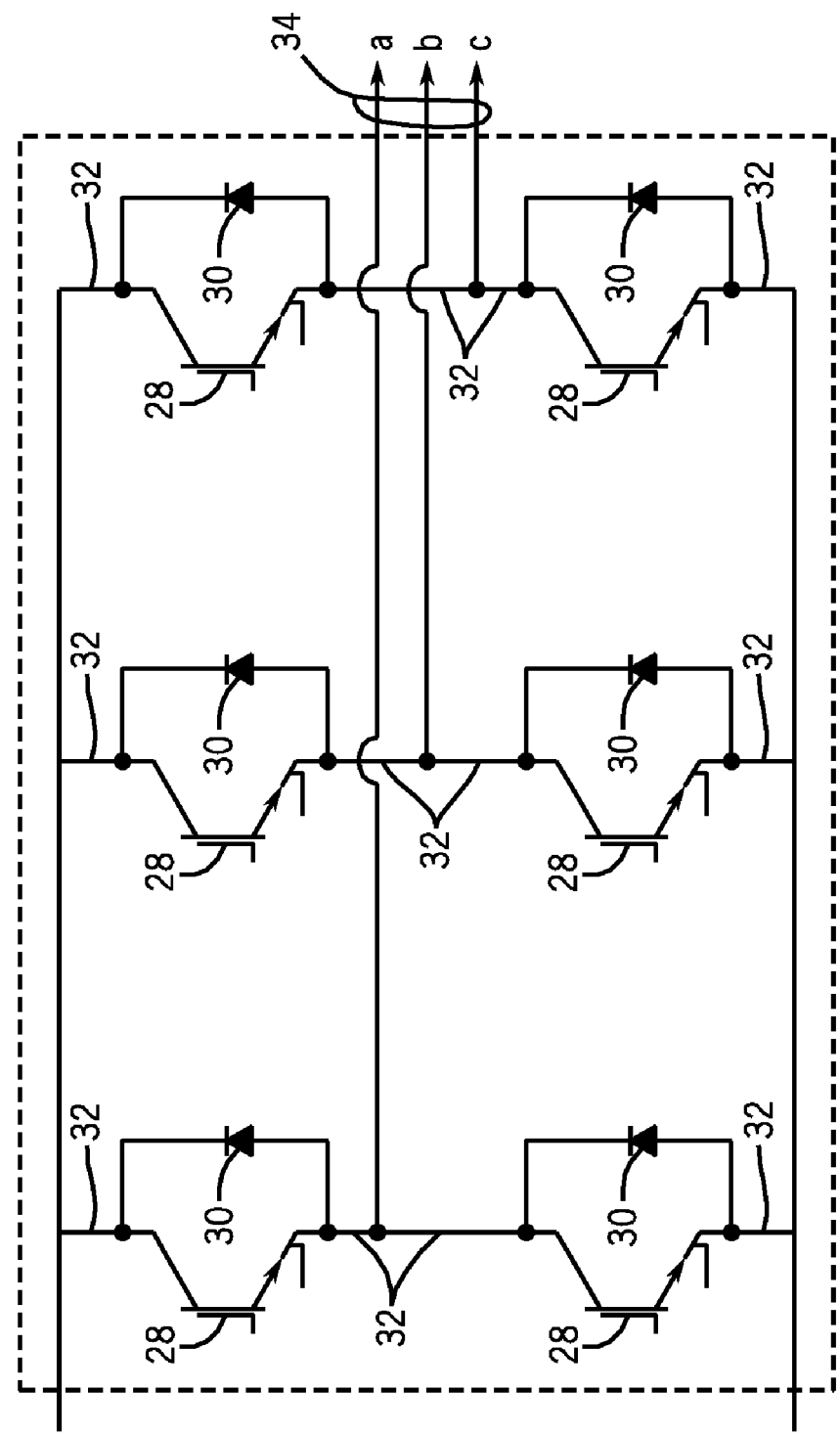
FIG. 2 is a simplified circuit diagram illustrating an inverter module of the motor drive system of FIG. 1.

Referring to FIG. 2, an inverter module 16 may include a plurality of IGBTs 28 and power diodes 30. The IGBTs 28 and power diodes 30 are joined to positive or negative DC lines (as appropriate) and output lines a, b, or c with bond wires 32. As IGBTs 28 are rapidly switched on and off to produce a discretized three-phase output current waveform at the output 34, strain is placed on bond wires 32 as a result of deformation resulting from stresses of thermal cycling.

Figure 3:
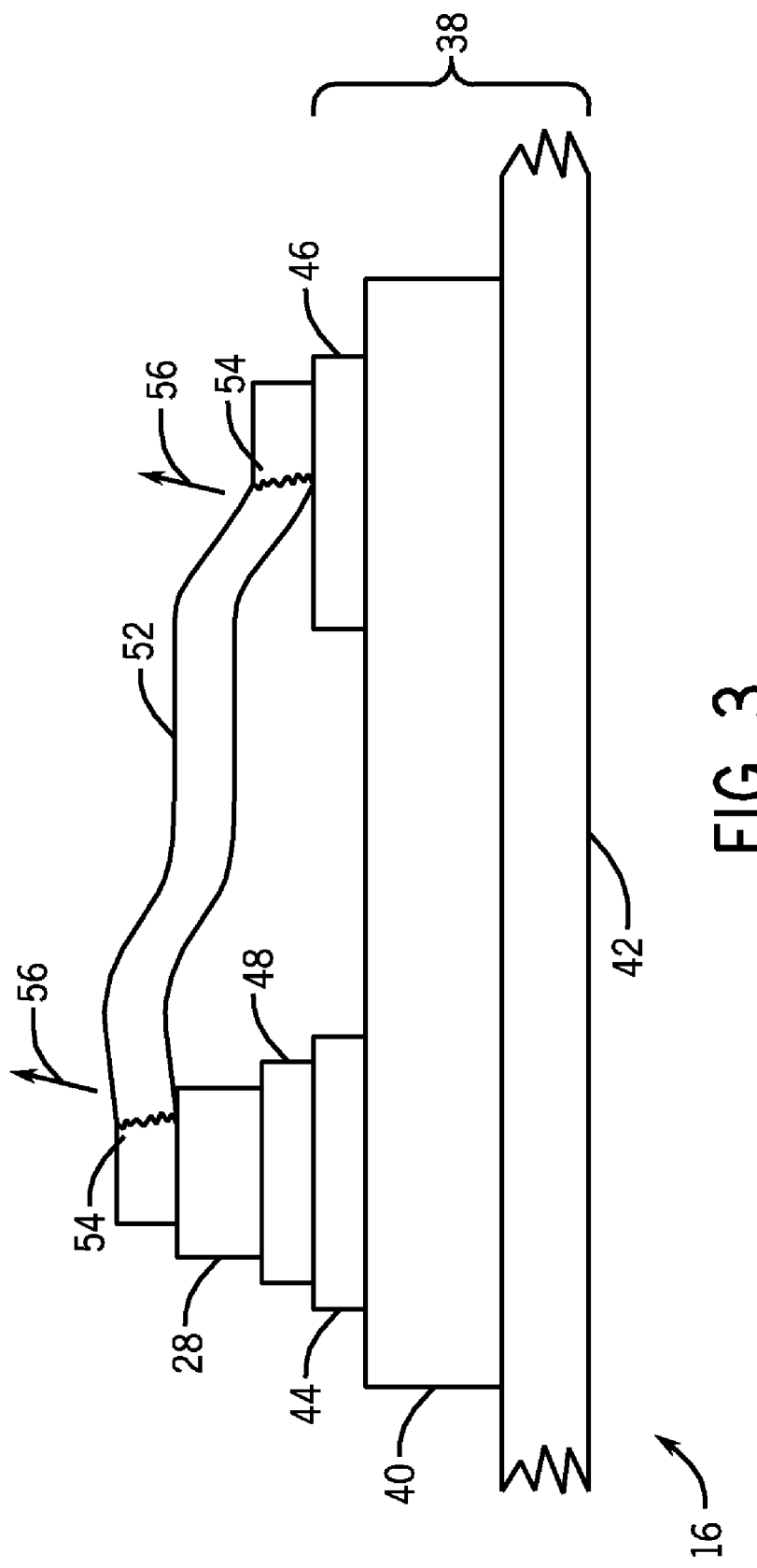
FIG. 3 is a side view of an IGBT of the inverter module shown in FIG. 2, illustrating the failure modes associated therewith.

FIG. 3 illustrates a side view of a portion of the inverter module 16 exhibiting signs of bond wire failure due to cumulative deformation resulting from heat stress. The inverter module 16 may include a direct bond copper (DBC) substrate 38, which may include a ceramic base 40, a copper layer 42, and copper contacts 44 and 46. Above the DBC substrate 38, copper 44 is joined by solder 48 to the silicon IGBT 28. Bond wire 52 joins the IGBT 28 to the copper contact 46. High junction temperatures may tend to cause the DBC substrate 38 and the bond wire 52 to heat and expand unevenly, creating tension on the bond wire 52, particularly at the solder connections. As the temperature difference between the IGBT 28 and the DBC substrate 38 increases, the tension on the bond wire 52 also increases due to the different rates of thermal expansion of the bond wire 52 and the DBC substrate 38. Therefore, the junction temperature variation of the IGBT 28, may have a pronounced effect on the life of the inverter module. As will be discussed further below, the junction temperature variation may tend to be greatest during startup or low-speed, high-current conditions. After numerous power cycles are applied to the IGBT 28, deformation of the bond wire 52 may tend to cause heel cracks 54 in bond wire 52. Additionally, the bond wire 52 may begin to separate from silicon chip 46 or metal plate 50 due to lift-off 56. When a heel crack 54 or lift-off 56 severs bond wire 52 completely, the IGBT 28 may become inoperable.

Figure 4:
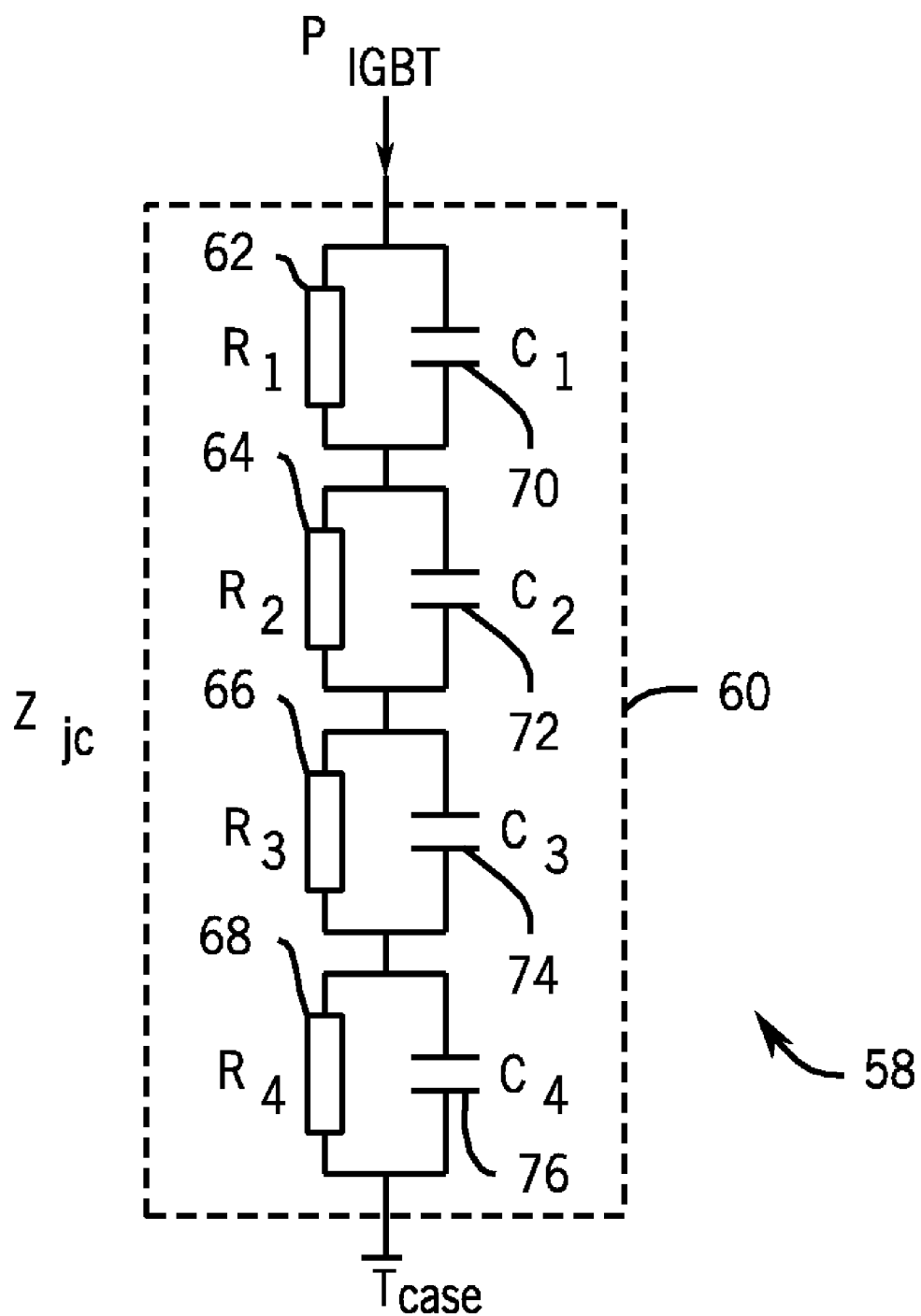
FIG. 4 depicts a thermal network model of the inverter module shown in FIG. 2.

FIG. 4 illustrates a thermal network model 58 illustrating the junction-to-case thermal impedance $Z_{jc}$ 60. The junction-to-case thermal impedance $Z_{jc}$ 60 includes four thermal impedances in series, each corresponding with one of the physical layers shown in FIG. 3. Each thermal impedance includes a thermal resistance and a thermal capacitance joined in parallel. Thermal resistances include $R_1$ 62, $R_2$ 64, $R_3$ 66, and $R_4$ 68, and thermal capacitances include $C_1$ 70, $C_2$ 72, $C_3$ 74, and $C_4$ 76, values for which may generally be obtained from a datasheet provided by the manufacturer of inverter module 16. The thermal network may be used to estimate the temperature difference between a junction of the solid state IGBT and the case to which the IGBT is mounted, as will be explained further below. It will be appreciated that the thermal network 58 may be different for different inverter modules, and may include more or fewer thermal impedance elements.

Figure 5:
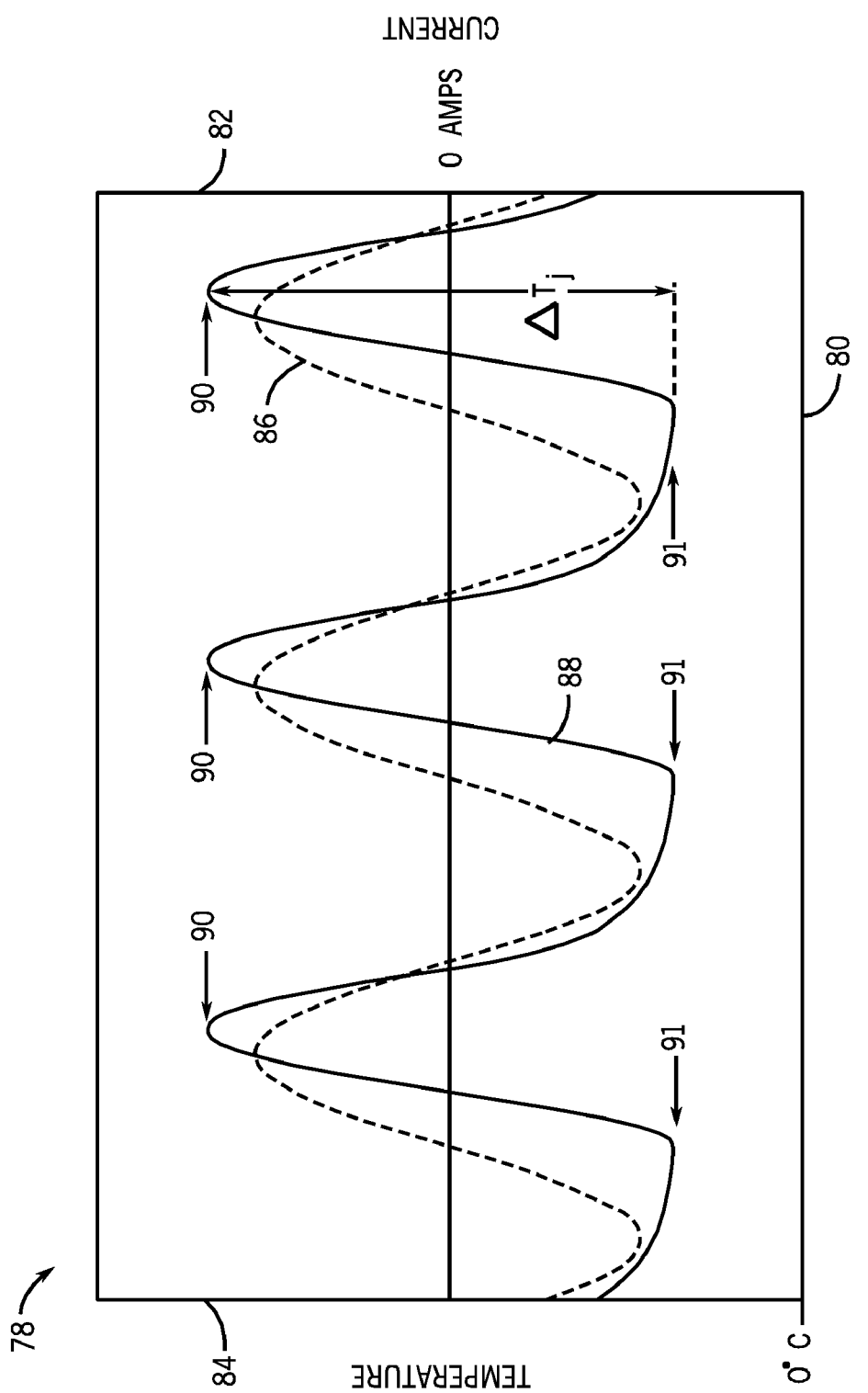
FIG. 5 is a graph illustrating the junction temperature variation in relation to the output current.

FIG. 5 depicts a graph 78 showing the junction temperature variation of a typical inverter module 16 with respect to time, overlaid with the current output of the inverter module 16. The graph 78 includes a horizontal axis 80, which represents time, and two vertical axes 82 and 84. The right side vertical axis 82 represents current and the left vertical axis 84 represents temperature. Trace 86 represents the current output of one phase of the inverter module. It should be noted that because the current output varies about a zero point, two IGBTs 28 may be utilized, one for the positive polarity and one for the negative polarity. Trace 88 represents the junction temperature of one of the IGBTs 28 producing the current output depicted by trace 86. It should also be noted that because the IGBT 28 represented is in the off state during the negative polarity current output, the IGBT 28 continues to cool during this time period, as shown by trace 88. It will be appreciated that the current generated on the diodes 30 will also result in similar temperature characteristics.

As can be seen in the graph 78, the junction temperature reaches a peak 90 during each cycle of the output current and reaches a valley 91 after each half cycle. The junction temperature variation is defined as the difference between the peak 90 temperature and the valley 91 temperature. It will be appreciated that the thermal stresses discussed above may be greatest when the junction temperature reaches the peak 90. Therefore, some embodiments may include estimating the peak IGBT 28 junction temperature for one cycle of the output current. Still other embodiments may include estimating the peak diode 30 temperature for one cycle of the output current.

To estimate the IGBT 28 junction temperature variation, the thermal network 58, described above in relation to FIG. 4, may be factored by the peak junction temperature, as will be described below. Accordingly, embodiments of the present invention also include a method of estimating the peak junction temperature. In some embodiments, the estimated peak junction temperature may be based on the estimated power losses of the IGBTs 28. Furthermore, the estimated power losses of the IGBT 28 may be based on estimated operating conditions of the IGBTs 28. For example, peak IGBT 28 junction temperature estimates may be based on estimated conduction losses and switching losses as calculated according to the following equations:

$$P_c(f, I_{RMS}) = \left(\frac{1}{2\cdot\pi} + \frac{M(f)\cdot Pf}{8}\right)\cdot V_t \cdot \sqrt{2}\cdot I_{RMS} + \left(\frac{1}{8} + \frac{M(f)\cdot PF}{3\cdot\pi}\right)\cdot R_t \cdot 2\cdot I_{RMS}^2; \quad (1)$$

$$P_s(f_s, I_{RMS}) = \frac{1}{\pi}\cdot f_s \cdot E_{onoff} \cdot \left(\frac{\sqrt{2}\cdot I_{RMS}}{I_{nom}}\right)\cdot\left(\frac{V_{DC}}{V_{nom}}\right); \quad (2)$$

$$P(f, f_s, I_{RMS}) = P_c(f, I_{RMS}) + P_s(f_s, I_{RMS}); \quad (3)$$

wherein $P_c$ equals the estimated conduction power loss as a function of the fundamental frequency, f, and the output RMS current of the drive, $I_{RMS}$; $P_s$ equals the estimated switching power losses as a function of the switching frequency, $f_s$, and the output RMS current of the drive, $I_{RMS}$; and $P(f, f_s, I_{RMS})$ equals the total estimated power losses of the IGBT 28. In equation (1), M(f) represents the modulation index and PF represents the power factor of a load driven by the inverter module 16. In equation (1), $V_t$ represents the approximate IGBT 28 conduction voltage at small or near zero forward current and $R_t$ represents the approximate slope resistance. Both $V_t$ and $R_t$ may be derived from a manufacturer datasheet. In equation (2), $E_{onoff}$ represents the total energy required to switch the IGBT 28 on and off at a rated voltage $V_{nom}$ (half of the IGBT rated voltage) and current $I_{nom}$ (rated IGBT module current) of the IGBT 28. All three of $E_{onoff}$, $V_{nom}$, and $I_{nom}$ may be obtained from manufacturer data sheets. $I_{RMS}$ and $V_{DC}$ represent the estimated operating current and bus voltage of the IGBT 28. Therefore, both $I_{RMS}/I_{nom}$ and $V_{DC}/V_{nom}$ act as scaling factors applied to the switching loss value, $E_{onoff}$, may obtained from the manufacturing data sheet. The total power loss, P, may then be used to calculate the junction temperature variation using the thermal network 16, as described below.

In some embodiments, the calculation of the junction temperature variation, ($\Delta T_j$), may be simplified by assuming that the temperature variation of the case is negligible. As such, a "boost factor" (BF(f)) may be first calculated, based on the thermal network 58 according to the following equation:

$$BF(f) = 1 + \sum_{i=1}^{4} \frac{R_i}{R_{jc}} \cdot \frac{\pi - 1}{\sqrt{1 + (2\pi \cdot f \cdot \tau_i)^2}}; \quad (4)$$

Wherein $R_i$ and $\tau_i$ equal the thermal resistances and capacitances of the thermal network, as shown in FIG. 4, and $R_{jc}$ equals the overall thermal resistance between the junction and the case. Furthermore, an interim value, $BF\_\Delta T_j$, may be calculated from the boost factor, according to the following equations:

$$BF\_\Delta T_j(f) = 1.85 \cdot (BF(f) - 1) \text{ if } BF(f) < 2 \quad (5);$$

$$BF\_\Delta T_j(f) = BF(f) \text{ if } BF(f) > 2 \quad (6).$$

Having obtained the estimated power losses and the boost factor, the estimated junction temperature variation, $\Delta T_j$, may then be approximated according to the following formula:

$$\Delta T_j(f, f_s, I_{rms}) = PI(f, f_s, I_{rms}) \cdot BF\_\Delta T_j(f) \cdot R_j \quad (15).$$

Wherein, $\Delta T_j$ represents the junction temperature variation after one output cycle of the inverter module.

It will be appreciated that variations of the above formulas may be made while still falling within the scope of the present invention. Additionally, in some embodiments one or more of the variables, such as $I_{RMS}$, $E_{onoff}$ or $V_{DC}$ for example, may be measured. Alternatively, these variables may also be estimated based on average known operating conditions of typical inverter modules or a particular inverter module. Additionally, in some embodiments, the diode 30 junction temperature variation may estimated rather than the IGBT junction temperature variation.

Figure 6:
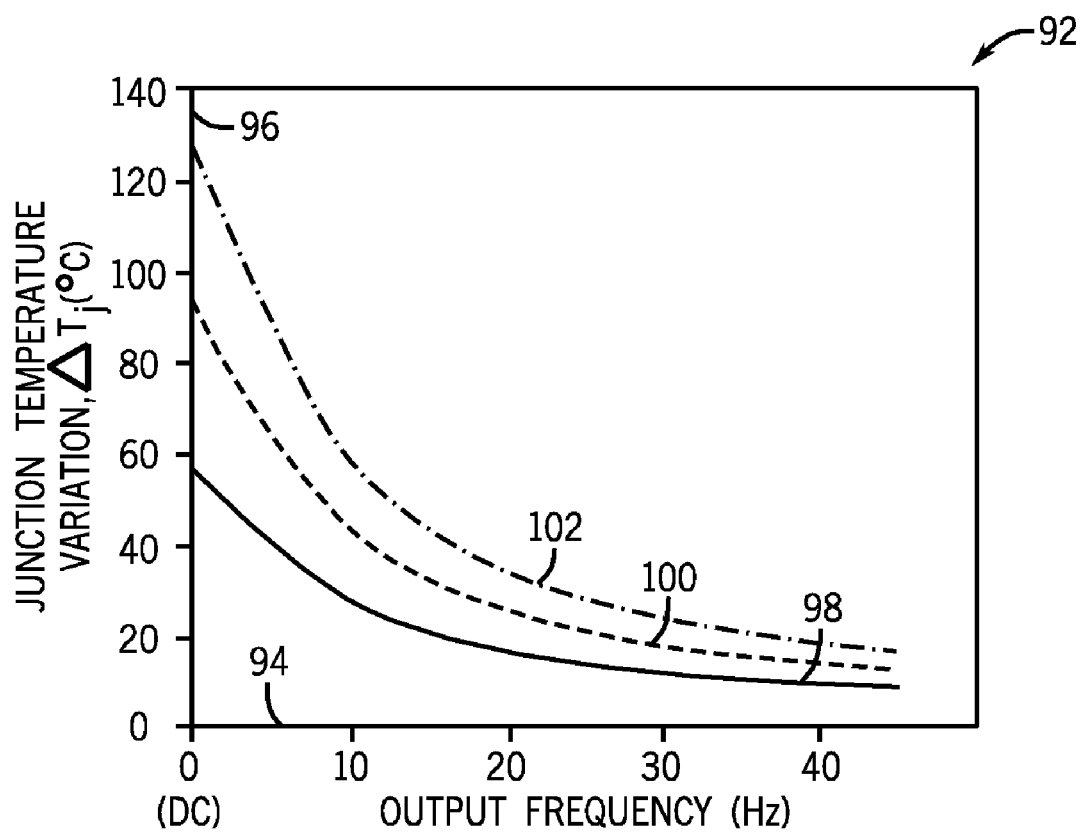
FIG. 6 is a graph illustrating the maximum junction temperature variation as a function of the switching frequency and the output frequency.

Turning now to FIG. 6, a graph 92 showing the junction temperature variation, $\Delta T_j$, of a typical inverter module is depicted. Specifically, the graph 92 depicts $\Delta T_j$ versus the fundamental frequency, i.e. the output frequency of the inverter module, at IGBT switching frequencies of 4 kHz (trace 98), 8 kHz (trace 100), and 12 kHz (trace 102).

As can be seen in graph 92, $\Delta T_j$ may tend to be greater when the inverter module is operating at a low fundamental frequency and greatest for the DC condition. This may be due to the fact that current will tend to be concentrated on an individual IGBT 28 for a longer time period when the inverter is operating at lower output frequencies. Because typical motor drives may operate at lower speeds during startup, higher junction temperature variation may also be present during startup.

Furthermore, as can also be seen in the graph 92, $\Delta T_j$ may tend to be greater for higher switching frequencies. This may be due to the fact that most of the power losses in an IGBT 28 occur during the brief transitional period when the IGBT 28 is switching on or off. Therefore, higher switching frequencies tend to result in higher junction temperatures and higher junction temperature variations.

It will also be appreciated that IGBTs 28 generally conduct higher levels of current at startup due, in part, to the lower frequency and low impedance of the motor windings under this condition, wherein the motor windings are magnetized. All of the above factors may contribute to higher levels of inverter module wear during startup conditions, which, as discussed above, may eventually lead to failure. Therefore, in order to reduce excessive inverter module wear at startup, embodiments of the present invention include temporarily reducing the switching frequency of the inverter module 16, thereby reducing the junction temperature variation and thermal stress on the IGBTs 28.

Figure 7:
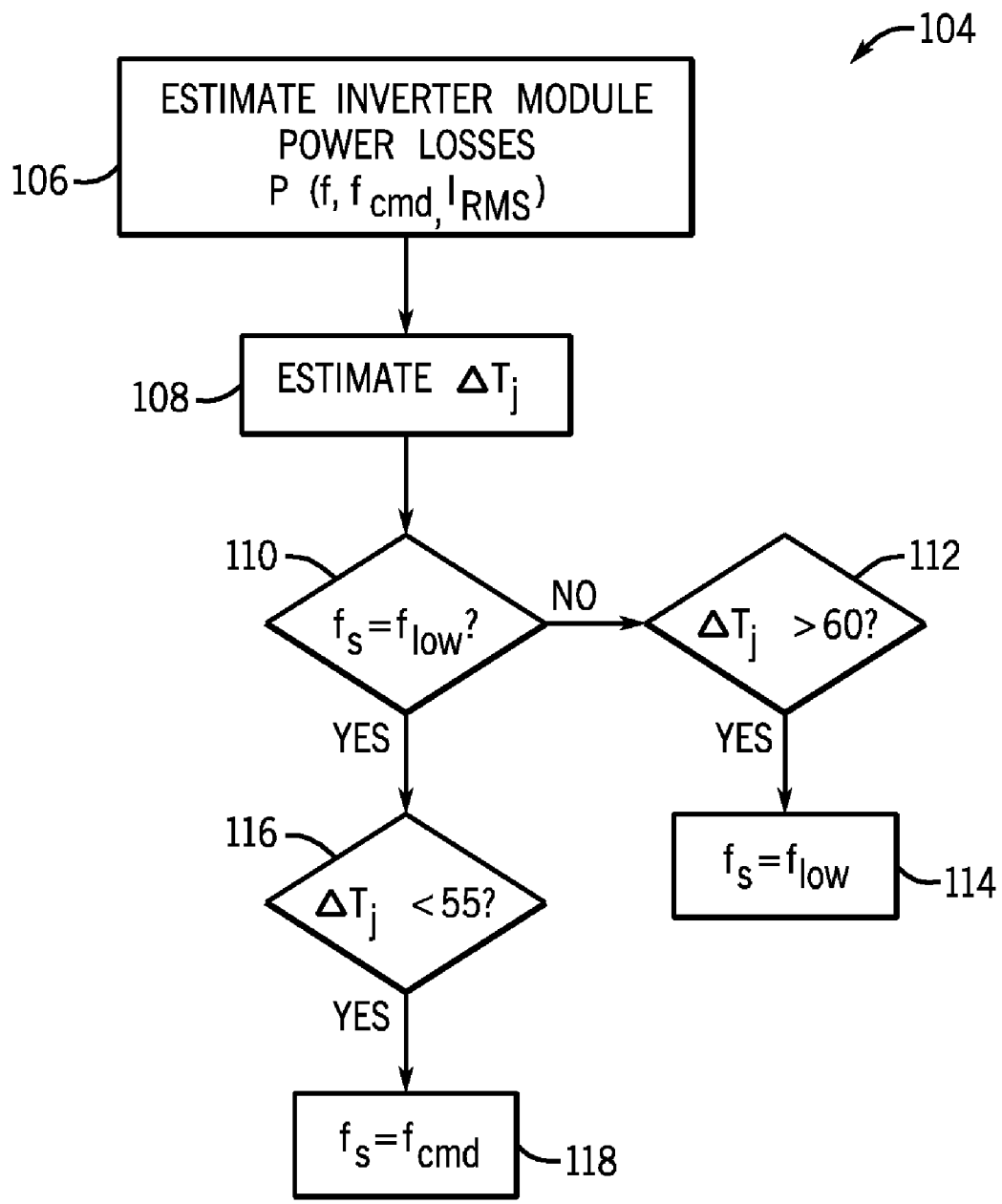
FIG. 7 is a flowchart depicting one method of controlling the switching frequency of an inverter module.

FIG. 7 depicts a flow chart of a process 104 for reducing the switching frequency (depicted in FIG. 7 as "$f_s$") in accordance with embodiments of the present invention. In some embodiments, the process 104 may be implemented in the control circuitry 22, discussed in relation to FIG. 1. First, at step 106, the power losses of the IGBTs 28 may be estimated using equation (3) as described above. In some embodiments, the power losses estimated at step 106 may be based on known or estimated operating values and conditions. In other embodiments, one or more values, such as RMS current for example, may be based on measurements, such as measurements performed by the sensor(s) 26 (see FIG. 1) and communicated back to the control circuitry 22.

Next, at step 108, the power losses may be used to calculate an estimated junction temperature variation, $\Delta T_j$. Then, at steps 110-116, the estimated junction temperature variation is used to determine the switching frequency. Embodiments of the present invention may toggle the switching frequency between two alternate values: a command frequency (depicted as "$f_{cmd}$") and a low frequency (depicted as "$f_{low}$"). The command frequency is the switching frequency at which the inverter module is intended to be operated under most conditions. For example, the command frequency may be a relatively high switching frequency, on the order of four thousand to twelve thousand Hertz, used to create a smooth sinusoidal waveform, which may minimize noise in some systems. The low frequency is the temporary switching frequency that is used to minimize IGBT stress. For example, in some embodiments, the low frequency may be approximately two thousand Hertz. Both the command frequency and the low frequency may be programmed into the driver circuitry 18 or the control circuitry 22 and may be specified by the user, such as through the remote control circuitry 24 (see FIG. 1).

At step 110 it is determined whether the switching frequency ($f_s$) equals the low frequency ($f_{low}$). If the switching frequency equals the low frequency at step 110, then process 104 branches to steps 116 and 118, wherein the switching frequency may be increased to the command frequency ($f_{cmd}$). Specifically, if $\Delta T_j$ is below a specified temperature at step 116, in this case fifty-five degrees Celsius, then the process 104 proceeds to step 118, at which point the switching frequency is set to the command frequency. However, if, at step 110, the switching frequency does not equal the low frequency then process 104 branches to steps 112-114, wherein the switching frequency may be reduced to the low frequency. Specifically, if $\Delta T_j$ is above a specified temperature at step 112, in this case sixty degrees Celsius, then process 104 proceeds to step 114, at which point the switching frequency is set to the low frequency. The process 104 may then repeat, starting at step 106.

According to process 104, if the junction temperature variation rises above sixty degrees Celsius, the switching frequency will be reduced. Thereafter, if the junction temperature variation drops below fifty-five degrees Celsius then the switching frequency will increase back to the command frequency. Referring to FIG. 6, it will be appreciated that the result of the process 104 described above is that the switching frequency may be low only for a short time after start-up.

It will also be appreciated that variations of the above process may be made while still falling within the scope of the present invention. For example, some embodiments may include varying the switching frequency of the inverter module between three or more frequency values, depending on the estimated junction temperature variation. For another example, some embodiments may include predetermining the expected junction temperature variation for given operating conditions or a given inverter module. Furthermore, the switching frequency may be initially set to the low frequency at startup and increased to the command frequency when the fundamental frequency of the inverter module 16 is above a specified frequency chosen based on the expected junction temperature variation for that fundamental frequency. Furthermore, in other embodiments, the diode 30 junction temperature variation may be used to reduce the switching frequency instead of the IGBT junction temperature variation.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of delivering power to a load comprising:
    activating and deactivating a solid state switch at a specified switching frequency to generate an output current waveform;
    determining a junction temperature variation of the solid state switch; and
    reducing the switching frequency based upon the junction temperature variation.

2. The method of claim 1, comprising increasing the switching frequency if the junction temperature variation is lower than a specified low temperature.

3. The method of claim 2, wherein the switching frequency is reduced if the temperature difference is higher than 60 degrees Celsius and is increased thereafter if the temperature difference is lower than approximately 55 degrees Celsius.

4. The method of claim 1, wherein determining a junction temperature variation of the solid state switch comprises estimating a power loss of the solid state switch.

5. The method of claim 1, wherein determining a junction temperature variation of the solid state switch comprises determining a thermal impedance between the solid state switch and a case to which the solid state switch is mounted.

6. The method of claim 1, wherein determining the junction temperature variation comprises calculating a boost factor.

7. The method of claim 1, wherein determining the junction temperature variation comprises estimating a peak junction temperature for one cycle of the output current waveform.

8. A method of operating an inverter module, comprising:
    activating and deactivating a solid state switch at a switching frequency to generate an output current waveform, wherein the solid state switch is electrically coupled in parallel to a diode; and
    varying the switching frequency based on a determined temperature variation of the solid state switch or the diode.

9. The method of claim 8, wherein varying the switching frequency comprises setting the switching frequency to a specified high frequency if the determined temperature variation is below a low temperature threshold, and setting the switching frequency to a specified low frequency if the determined temperature variation is above a high temperature threshold.

10. The method of claim 9, wherein the high temperature threshold is approximately 60 degrees Celsius and the low temperature threshold is approximately 55 degrees Celsius.

11. The method of claim 8, comprising generating an estimated temperature of the solid state switch.

12. The method of claim 11, wherein generating an estimated temperature of the solid state switch comprises estimating a power loss of the solid state switch.

13. The method of claim 8, comprising determining a temperature variation of the solid state switch.

14. The method of claim 13, wherein determining a temperature variation of the solid state switch comprises determining a thermal impedance between the solid state switch and a case to which the solid state switch is mounted.

15. The method of claim 13, wherein determining a temperature variation of the solid state switch comprises estimating a junction temperature variation for one cycle of the output current waveform.

16. A motor control system, comprising:
    an inverter module comprising a solid state switch coupled to a case, the inverter module configured to generate an output current waveform; and
    control circuitry coupled to the inverter module and configured to vary a switching frequency of the inverter module based on a determined junction temperature variation of the solid state switch.

17. The motor control system of claim 16, comprising junction temperature determination circuitry configured to determine the junction temperature of the solid state switch.

18. The motor control system of claim 17, wherein the junction temperature determination circuitry is configured to determine the junction temperature variation by estimating a power loss of the solid state switch.

19. The motor control system of claim 16, wherein the control circuitry is configured to vary the switching frequency of the inverter module based on the junction temperature variation of the solid state switch for one cycle of output current waveform.

20. The motor control system of claim 19, comprising junction temperature determination circuitry configured to determine the junction temperature variation of the solid state switch for one cycle of output current waveform.

21. The motor control system of claim 20, wherein the junction temperature determination circuitry is configured to factor the junction temperature variation by a thermal impedance between a junction of the solid state switch and the case.

22. The motor control system of claim 19, wherein the control circuitry is configured to increase the switching frequency of the inverter module if the junction temperature variation of the solid state switch is less than a specified low temperature and decrease the switching frequency of the inverter module if the junction temperature variation of the solid state switch is more than a specified high temperature 23. The motor control system of claim 22, wherein the specified high temperature is approximately 60 degrees Celsius and the specified low temperature is approximately 55 degrees Celsius.

* * * * *